(12) United States Patent
Yuzurihara

(10) Patent No.: US 7,342,269 B1
(45) Date of Patent: Mar. 11, 2008

(54) PHOTOELECTRIC CONVERSION DEVICE, AND PROCESS FOR ITS FABRICATION

(75) Inventor: Hiroshi Yuzurihara, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 518 days.

(21) Appl. No.: 09/633,175

(22) Filed: Aug. 4, 2000

(30) Foreign Application Priority Data

| Aug. 5, 1999 | (JP) | ................................ 11-223078 |
| Jul. 31, 2000 | (JP) | ............................ 2000-232108 |

(51) Int. Cl.
*H01L 31/062* (2006.01)

(52) U.S. Cl. ............... 257/292; 257/291; 257/444

(58) Field of Classification Search ........ 257/290–293, 257/444, 461, 467, E27.132, E27.133; 438/48
See application file for complete search history.

(56) References Cited

U.S. PATENT DOCUMENTS

| 5,567,652 A * | 10/1996 | Nishio .................... 438/555 |
| 5,698,844 A | 12/1997 | Shinohara et al. |
| 5,861,620 A | 1/1999 | Takahashi et al. |
| 5,955,753 A | 9/1999 | Takahashi |
| 6,040,593 A * | 3/2000 | Park ........................ 257/292 |
| 6,137,127 A * | 10/2000 | Merrill .................... 257/292 |
| 6,399,485 B1 | 6/2002 | Hatano et al. |
| 6,448,104 B1 * | 9/2002 | Watanabe ................ 438/60 |
| 6,472,699 B1 | 10/2002 | Sugiyama et al. |
| 6,563,187 B1 * | 5/2003 | Park ........................ 257/446 |
| 6,570,622 B2 | 5/2003 | Shibayama et al. |

| 2001/0030332 A1 | 10/2001 | Asada et al. |
| 2003/0137008 A1 | 7/2003 | Nozaki et al. |

FOREIGN PATENT DOCUMENTS

| JP | 60-001980 | 1/1985 |
| JP | 01-205462 | 8/1989 |
| JP | 06-125069 | 5/1994 |
| JP | 6-326289 | 11/1994 |
| JP | 7-335890 | 12/1995 |
| JP | 08-162624 | 6/1996 |
| JP | 11-075114 | 3/1999 |
| JP | 11-111974 | 4/1999 |
| JP | 11-187307 | 7/1999 |
| JP | 2000-31449 | 1/2000 |
| JP | 2001-044404 | 2/2001 |
| JP | 2001-156280 | 6/2001 |
| JP | 2001-298176 | 10/2001 |
| JP | 2001-345439 | 12/2001 |

* cited by examiner

*Primary Examiner*—Hung Vu
(74) *Attorney, Agent, or Firm*—Fitzpatrick, Cella, Harper & Scinto

(57) ABSTRACT

In a photoelectric conversion device comprising a photoelectric-conversion section and a peripheral circuit section where signals sent from the photoelectric-conversion section are processed, the both sections being provided on the same semiconductor substrate, a semiconductor compound layer of a high-melting point metal is provided on the source and drain and a gate electrode of an MOS transistor that forms the peripheral circuit section, and the top surface of a semiconductor diffusion layer that serves as a light-receiving part of the photoelectric conversion section is in contact with an insulating layer.

15 Claims, 11 Drawing Sheets

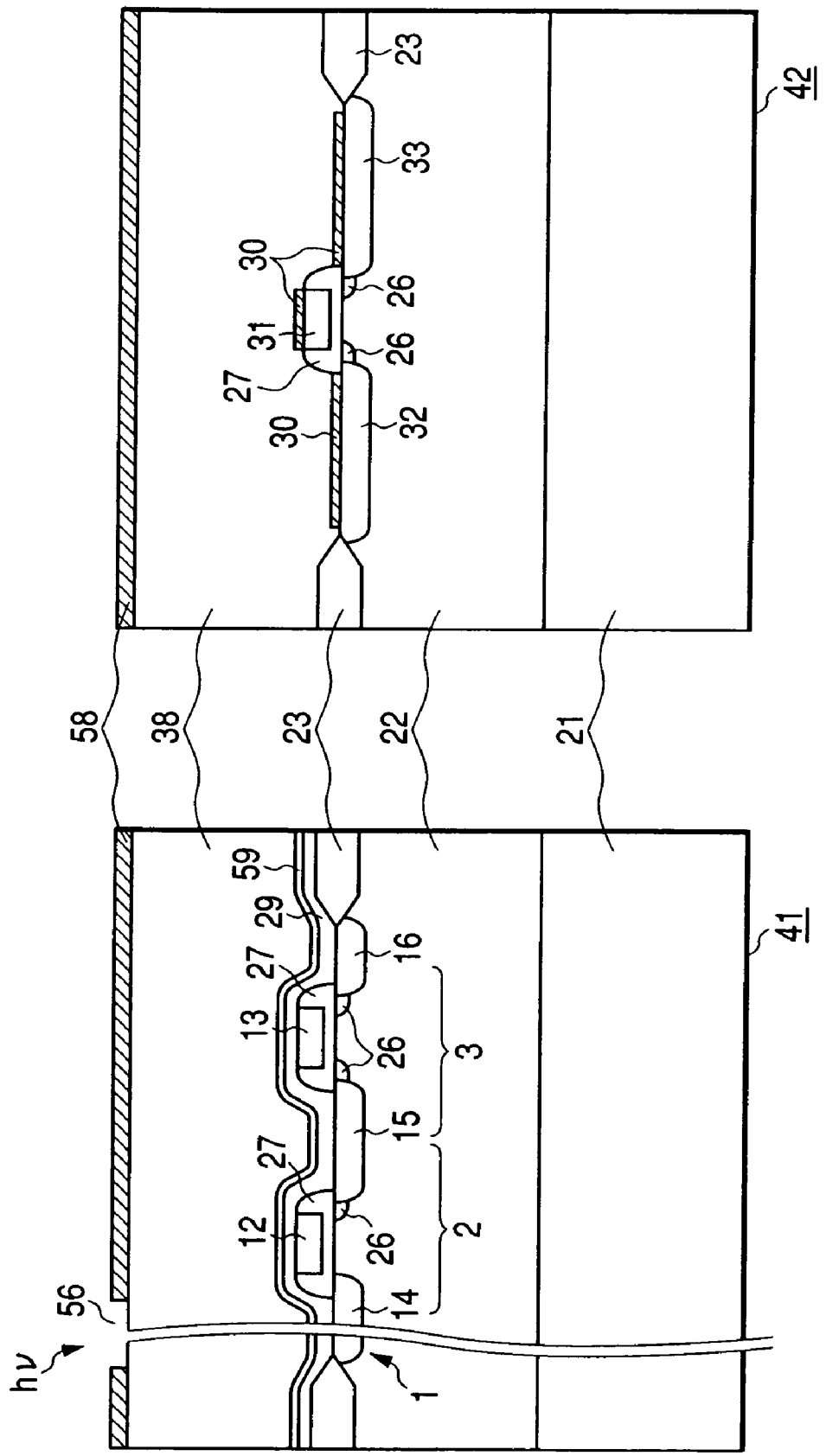

PHOTOELECTRIC CONVERSION DEVICE, AND PROCESS FOR ITS FABRICATION

BACKGROUND OF THE INVENTION

1. Field of the Invention

This invention relates to a photoelectric conversion device used in information processing devices such as digital still cameras, digital video cameras and image scanners. More particularly, it relates to a photoelectric conversion device having a peripheral circuit for reading electrical charges created in a light-receiving part, and a process for its fabrication.

2. Related Background Art

Photoelectric conversion devices which convert object images into electric signals include semiconductor devices of a CCD (charge-coupled device) type or an MOS (metal-oxide semiconductor) type. Recently, many have sought to improve the image-reading speed of photoelectric conversion devices. As a means therefor, peripheral circuits are made high-speed, or various peripheral circuits are integrated on the same chip as that of a photoelectric conversion section. In particular, in MOS-type photoelectric conversion devices, photoelectric conversion sections and peripheral circuit sections can be formed by a common fabrication process and hence both can be integrated on the same chip with ease. As the MOS-type photoelectric conversion devices, U.S. Pat. Nos. 5,698,844; 5,861,620; 5,955,753 and others disclose devices constituted of a light-receiving section and a signal-processing MOS transistor.

FIG. 12 is a circuit diagram of a conventional MOS-type photoelectric conversion device. In FIG. 12, reference numeral 1 denotes a diode as a light-receiving element; 2, a charge transfer MOS transistor for transferring electrical charges created in the light-receiving element 1; 3, a reset MOS transistor which, upon application of a reset pulse to a gate electrode, performs reset action on the electrical charges transferred. Reference numeral 4 denotes a selecting MOS transistor which applies a selection pulse to the gate electrode to make the circuit on; and 5, an amplifying MOS transistor which amplifies the electrical charges transferred to a floating gate. Signal charges are once stored in a storage capacitor 7 from a source follower consisting of the transistors 4 and 5 via a charge transfer MOS transistor 8 which performs transfer action according to transfer pulses, and thereafter the electrical charges of the storage capacitor 7 are outputted from an output terminal 10 as signals amplified through an amplifier 9.

FIG. 13 shows a cross-sectional structure of a photoelectric conversion section 41 having the light-receiving element 1, the charge transfer MOS transistor 2 and the reset MOS transistor 3, and a cross-sectional structure of an MOS transistor constituting a peripheral circuit section 42. Reference numeral 21 denotes a semiconductor substrate; 22, a well having a conductivity-type different from that of the semiconductor substrate 21; 23, an isolation region formed by selective oxidation called LOCOS (local oxidation of silicon); 25, a semiconductor diffusion layer serving as the light-receiving part of the light-receiving element 1; and 38, an insulating layer. Reference numerals 32 and 33 denote a source and a drain, respectively, and 31, a gate electrode. Contact holes to be formed in the isolation region 38 and electrodes formed therein are omitted in the illustration.

In logic circuits making use of MOS transistors, a salicide structure (self-aligned silicidation) is employed in which a semiconductor compound of a high-melting point metal is selectively formed on the gate electrode.

An MOS transistor having this salicide structure is cross-sectionally shown in FIG. 14.

As shown in FIG. 14, a well 122 is formed on a semiconductor substrate 121, a gate 131, a drain 132 and a source 133 are formed, and silicide layers 130 formed of, e.g., a cobalt silicide are formed on their top surfaces.

Then, on this MOS transistor, an insulating protective layer 138 is overlaid, and a gate electrode 136, a source electrode 137 and a drain electrode 135 are formed, thus a logic circuit is set up.

A solid-state imaging device provided with a silicide film only on the source and drain of a CMD device (charge modulation device) is also disclosed in Japanese Patent Application Laid-Open No. 6-326289.

In the CMD device, however, the light is received through a gate electrode formed of polycrystalline silicon and the electrical charges created by light in the underlying channel region are stored, and hence the device has been unsatisfactory in respect of sensitivity.

Meanwhile, where the salicide structure as shown in FIG. 14 is employed in the MOS-type photoelectric conversion devices for the purpose of high-speed operation, electric currents may leak from the photoelectric conversion section in a large quantity to cause deterioration of photoelectric conversion characteristics.

SUMMARY OF THE INVENTION

An object of the present invention is to provide a photoelectric conversion device that is operable at a high speed without causing any deterioration in the characteristics of the photoelectric conversion section, and a process for its fabrication.

As the gist of the photoelectric conversion device of the present invention, it is a photoelectric conversion device comprising a photoelectric conversion section and a peripheral circuit section where signals sent from the photoelectric conversion section are processed, both sections being provided on the same semiconductor substrate. A semiconductor compound layer of a high-melting point metal is provided on the source, drain and a gate electrode of an MOS transistor that forms the peripheral circuit section, and the top surface of a semiconductor diffusion layer that serves as a light-receiving part of the photoelectric conversion section is in contact with an insulating layer.

As the gist of the process for fabricating the photoelectric conversion device of the present invention, it is a process for fabricating a photoelectric conversion device comprising a photoelectric conversion section and a peripheral circuit section where signals sent from the photoelectric conversion section are processed, both sections being provided on the same semiconductor substrate. The process comprises the steps of covering with a semiconductor compound formation barrier layer the top surface of a semiconductor diffusion layer that serves as a light-receiving part of the photoelectric conversion section, and forming a semiconductor compound layer of a high-melting point metal on source and drain regions and a gate-electrode conductive layer of an MOS transistor, which are not covered with the semiconductor compound formation barrier layer.

According to the present invention, since the semiconductor compound layer of a high-melting point metal is not in contact with at least the semiconductor diffusion layer serving as a light-receiving part, any leakage currents can be prevented in the light-receiving part.

In addition, since in the MOS transistor constituting the peripheral circuit the semiconductor compound layer of a high-melting point metal is provided on each of the gate electrode, the source and the drain, it has a low resistance and even a microtransistor is operable in a high speed.

BRIEF DESCRIPTION OF THE DRAWINGS

FIG. 7 is a diagrammatic cross-sectional view of the photoelectric conversion device according to another embodiment of the present invention.

FIGS. 9A, 96B, 9C, 9D and 9E are diagrammatic cross-sectional views which illustrate a process for fabricating a photoelectric conversion device according to still another embodiment of the present invention.

DESCRIPTION OF THE PREFERRED EMBODIMENTS

The photoelectric conversion device according to the present invention will be described with reference to FIGS. 1 and 2.

Figure 1:
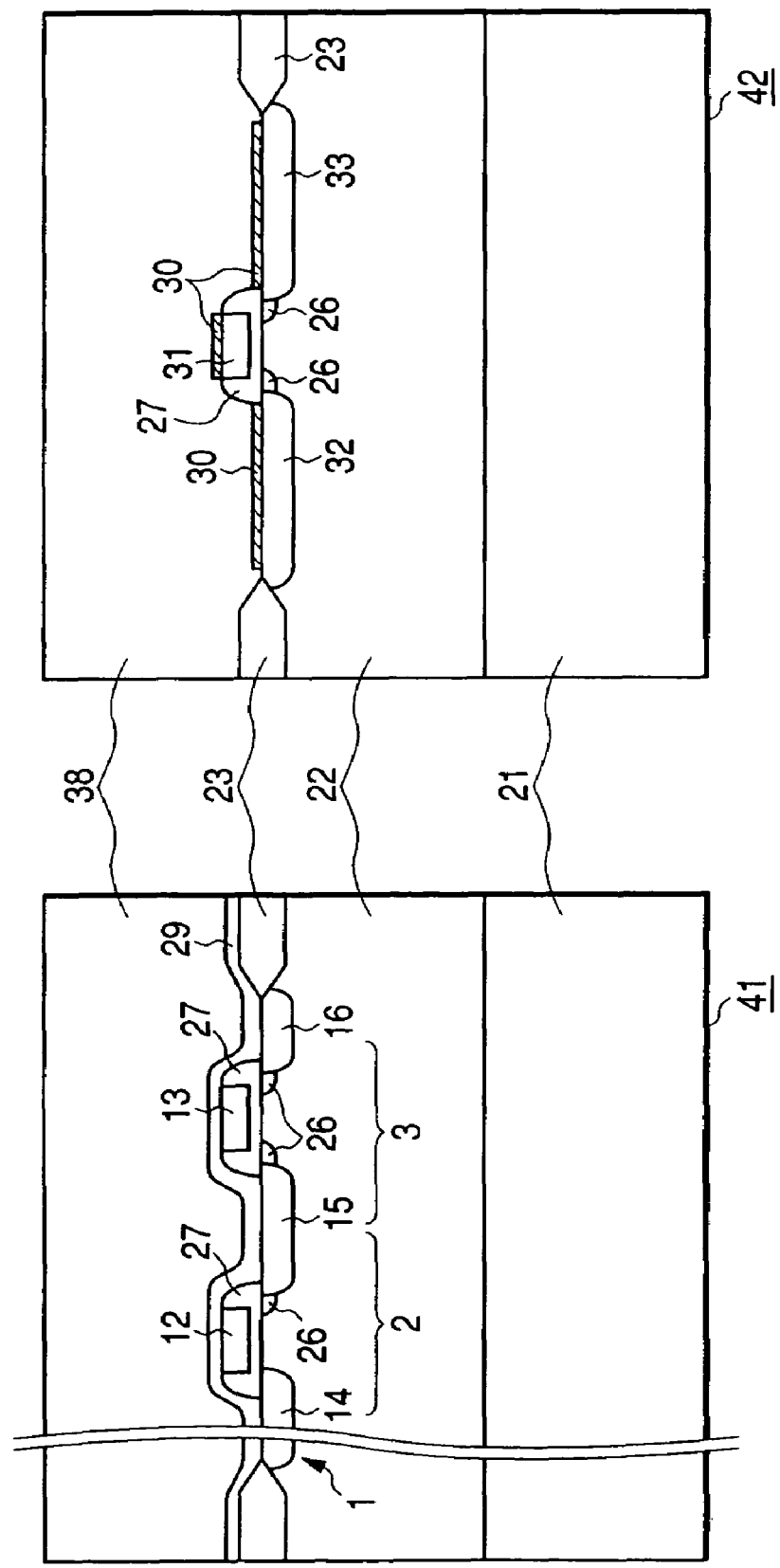
FIG. 1 is a diagrammatic cross-sectional view of the photoelectric conversion device according to the present invention.
Figure 2:
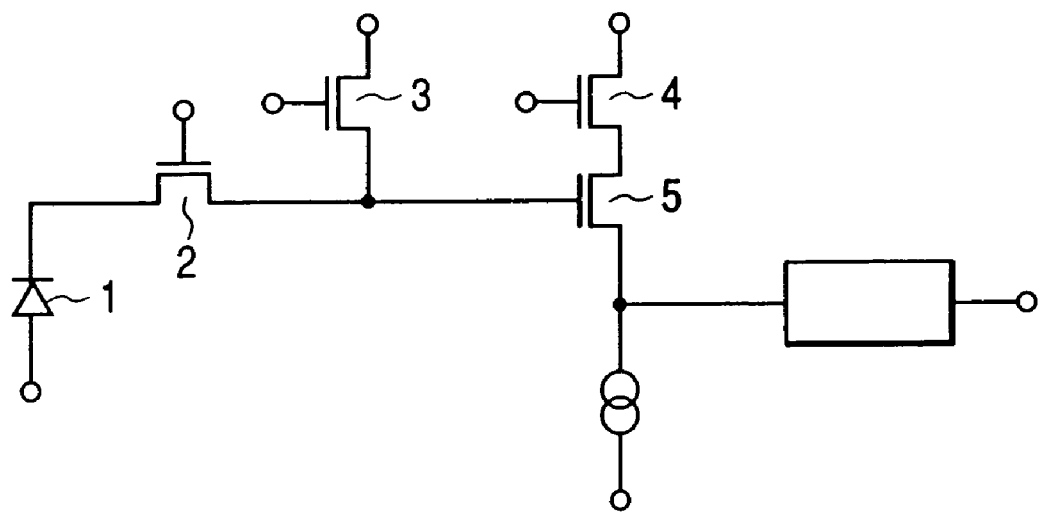
FIG. 2 is a circuit diagram of the photoelectric conversion device according to the present invention.

FIG. 1 is a diagrammatic cross-sectional view of the photoelectric conversion device, and FIG. 2 is a circuit diagram of the part corresponding to one pixel (picture element) of this photoelectric conversion device.

Here, its photoelectric conversion section has a light-receiving element 1, a charge transfer MOS transistor 2, a reset MOS transistor 3, an amplifying MOS transistor 5 and a selecting MOS transistor 4.

FIG. 1 shows a cross-sectional structure of a photoelectric conversion section 41 having, in particular, the light-receiving element 1, charge transfer MOS transistor 2 and reset MOS transistor 3 provided therein, and a cross-sectional structure of an MOS transistor constituting a peripheral circuit section 42 which processes signals sent from the photoelectric conversion section 41.

Electrodes and wirings which connect each MOS transistor are omitted from illustration. An example of wirings (a circuit) is as shown in FIG. 2.

Electrical charges (electrons here) created by light having entered a photodiode serving as the light-receiving element 1 are stored in the cathode of the photodiode. The charges thus stored are transferred by the charge transfer MOS transistor 2 to the gate of the amplifying MOS transistor 5, where the gate potential changes. A voltage is applied by the selecting MOS transistor 4 to the drain of the amplifying MOS transistor 5, whereupon amplified signals are read from the source of the amplifying MOS transistor 5. Then, immediately before the signals are read or after they have been read, the gate of the amplifying MOS transistor is reset to reference potential.

FIG. 2 shows an example of a circuit used in the photoelectric conversion device of the present invention. The present invention is usable in all types of photoelectric conversion devices called the MOS type.

In FIG. 1, reference numeral 12 denotes a gate electrode of the charge transfer MOS transistor 2; and 13, a gate electrode of the reset MOS transistor 3.

Reference numeral 14 denotes a semiconductor diffusion layer serving as the light-receiving part, and is formed of a semiconductor having a conductivity type opposite to that of a well 22. In order to improve sensitivity to visible light, this layer may optionally be made to have a junction depth larger than that of other diffusion layers.

Reference numeral 15 denotes a floating diffusion layer, and is formed of a semiconductor having a conductivity type opposite to that of the well 22.

Reference numeral 16 denotes a diffusion layer to which reference voltage for resetting is imparted.

Reference numeral 26 denotes a low-impurity-density diffusion layer for providing an LDD (lightly doped drain) structure, and has the same conductivity type as those of the diffusion layers 15, 16, 32 and 33 and also a lower impurity density than these.

Reference numeral 27 denotes a side spacer formed of, e.g., an insulating material; 29, an insulating film which keeps leakage currents from occurring at the surfaces of the semiconductor diffusion layer 14 and so forth and also functions to bar formation of the semiconductor compound of a high-melting point metal.

The source of the charge transfer MOS transistor 2 stands common to the light-receiving part semiconductor diffusion layer 14, and the drain of the charge transfer MOS transistor 2 stands common to the drain of the reset MOS transistor 3 to make up the floating diffusion layer 15. The floating diffusion layer 15 is connected to the amplifying MOS transistor 5 through an electrode (not shown), and the diffusion layer 16 is also connected to a reset reference voltage wiring (not shown) through an electrode.

In the MOS transistor of the peripheral circuit 42, reference numeral 31 denotes a gate electrode formed of, e.g., polycrystalline silicon; 32 and 33, diffusion layers serving as a source and a drain, respectively, which are formed of semiconductors having a conductivity type opposite to that of the well 22 and have a higher impurity density than the low-impurity-density diffusion layer 26.

Reference numeral 30 denotes the semiconductor compound layer of a high-melting point metal, and is provided on the top surface of the polycrystalline-silicon gate electrode 31 of the MOS transistor and on the top surfaces of the diffusion layers 32 and 33 serving as the source and drain. It has the function to lower their resistivities.

On the other hand, a semiconductor compound layer of a high-melting point metal is not formed on the top surface of the semiconductor diffusion layer 14 serving as the light-receiving part of the photodiode, the top surfaces of the gate electrodes of the MOS transistors 2 and 3 and the top surfaces of the drain and sources. These top surfaces come in contact with the insulating layer 29. If a layer with a low resistance is provided on the top surface of the semiconductor diffusion layer 14 or floating diffusion layer 15, leakage currents tend to occur at the surface. Such leakage currents tend to occur especially at ends of the semiconductor diffusion layer 14 and floating diffusion layer 15, i.e., the portions where p-n junctions terminate in the vicinity of boundaries between the isolation region 23 and the gate electrodes. Accordingly, the low-resistance layer like the semiconductor compound layer of a high-melting point metal should not be provided at ends of these layers 14 and 15 so that the surfaces of such end portions are covered with an insulating film such as a silicon oxide film. Also, in order to improve photoelectric conversion efficiency at the light-receiving part, the semiconductor compound layer of a high-melting point metal should not be provided on the light-incident side of the semiconductor diffusion layer 14.

When, however, contact holes are formed in the insulating layer to provide electrodes connected to the gate electrodes and diffusion layers, layers of a high-melting point metal or its semiconductor compound may be formed at the bottoms of such contact holes as layers of conductive materials.

The leakage currents will be described here.

Figure 3A:
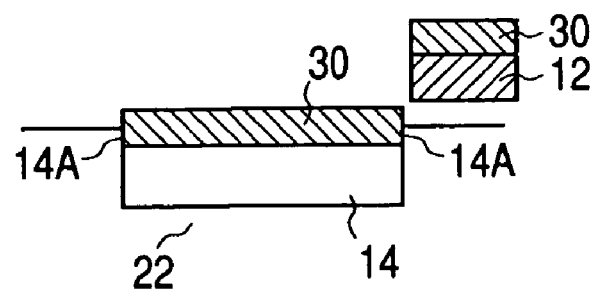
FIG. 3A is a cross-sectional view of a light-receiving part where a semiconductor compound layer of a high-melting point metal is formed.

If as shown in FIG. 3A a silicide layer 30 is formed also on the semiconductor diffusion layer 14, the latter has a low resistance at that part. If so, the p-n junction at end portions 14A of the semiconductor diffusion layer 14 is short-circuited because of the silicide to cause a leakage current. Such a leakage current is in so small a quantity as not to come into question so much in ordinary MOS transistors. In photoelectric conversion devices, however, it comes out as a noise, in particular, a fixed pattern noise.

Figure 3B:
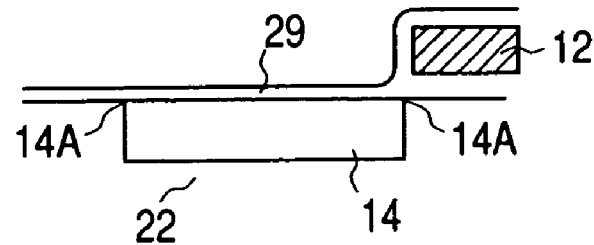
FIG. 3B is a diagrammatic cross-sectional view of a light-receiving part not having any semiconductor compound layer of a high-melting point metal.

Accordingly, as shown in FIG. 3B, the end portions 14A of the semiconductor diffusion layer 14 are covered with an insulating layer 29 so as to be protected. Since the p-n junction at end portions 14A of the semiconductor diffusion layer 14 is protected in contact with the insulating layer, the leakage current can be prevented from occurring. Then, in salicide processing, such an insulating layer prevents reaction with the high-melting point metal. This effect is commonly applicable to all embodiments of the present invention.

In the present invention, the part at which the surfaces are covered with insulating films without providing any semiconductor compound layer of a high-melting point metal may be only the light-receiving part, semiconductor diffusion layer 14. Also, only the semiconductor diffusion layer 14 and the gate electrode and source-drain of the charge transfer MOS transistor 2 may be so made as not to be provided with any semiconductor compound layer of a high-melting point metal. Still also, at least one of the reset MOS transistor 3, the amplifying MOS transistor 5 and the selecting MOS transistor 4 and the light-receiving part semiconductor diffusion layer 14 may be so made as not to be provided with any semiconductor compound layer of a high-melting point metal.

In the case of a circuit in which the light-receiving part semiconductor diffusion layer 14 is directly connected to the gate of the amplifying MOS transistor 5 without use of any charge transfer MOS transistor 2, the semiconductor diffusion layer 14 may not be provided with any semiconductor compound layer of a high-melting point metal and each of the amplifying MOS transistor, the reset MOS transistor and the selecting MOS transistor may be provided with the semiconductor compound layer of a high-melting point metal. Also, when the semiconductor diffusion layer 14 is set common to the source or drain of the reset MOS transistor, only the common layer may be so made as not to be provided with any semiconductor compound layer of a high-melting point metal.

Still also, in the case of a circuit construction in which the photoelectric conversion section corresponding to one pixel consists only of one photodiode and one charge transfer MOS transistor, only the light-receiving part semiconductor diffusion layer 14 may be so made as not to be provided with any semiconductor compound layer of a high-melting point metal, or the charge transfer MOS transistor is also made not to be provided with any semiconductor compound layer of a high-melting point metal.

As described above, the circuit of the photoelectric conversion section can be constructed in a variety of ways. In any case, the semiconductor compound layer of a high-melting point metal is not provided on at least the light-receiving part, semiconductor diffusion layer 14. Then, selection is made on whether or not the semiconductor compound layer of a high-melting point metal is provided on the gate electrode and the source and drain other than the semiconductor diffusion layer 14.

More preferably, when photoelectric conversion sections are arranged in a two-dimensional array, the semiconductor compound layer of a high-melting point metal may be provided only on the MOS transistor of the peripheral circuit other than the photoelectric conversion section without providing any semiconductor compound layer of a high-melting point metal on the whole photoelectric conversion section, as in one embodiment described later.

In order for only the light-receiving part, semiconductor diffusion layer not to be provided with any semiconductor compound layer of a high-melting point metal, an end of the layer for barring formation of a semiconductor compound of a high-melting point metal (the semiconductor compound formation barrier layer) must be registered (position-adjusted) in a high precision. Accordingly, as described later in another embodiment, the end of the semiconductor compound formation barrier layer may be so registered that the end is disposed on the gate electrode adjoining to the light-receiving element.

To form the peripheral circuit section used in the present invention, a shift register, a noise-eliminating circuit, an amplifier, a sample-and-hold circuit, an A/D (analog-to-digital) converter, a timing generator, a programmable gain amplifier, a logarithmic compressing circuit and so forth may optionally be used in appropriate combination into one chip. Accordingly, the MOS transistors constituting these may be provided with the semiconductor compound layer of a high-melting point metal so as to be improved in operational speed.

In another case where various logic circuits and memories are made into one chip, the MOS transistors constituting these may also be provided with the semiconductor compound layer of a high-melting point metal.

The peripheral circuit section may preferably be constituted using n-type MOS transistors and p-type MOS transistors produced by a CMOS (complementary metal-oxide semiconductor) fabrication process, which may each preferably be MOS transistors having an LDD structure.

The high-melting point metal used in the present invention is also called a refractory metal, and is at least one selected from the group consisting of titanium, nickel, cobalt, tungsten, molybdenum, tantalum, chromium, palladium, platinum, vanadium and zirconium, or an alloy composed chiefly of any of these.

The semiconductor compound layer of such a high-melting point metal used in the present invention is formed of at least one selected from the group consisting of titanium silicide, nickel silicide, cobalt silicide, tungsten silicide, molybdenum silicide, tantalum silicide, chromium silicide, palladium silicide, platinum silicide, vanadium silicide and zirconium silicide. Also, it may be a silicide of the above alloy. The surface of the semiconductor compound layer of the high-melting point metal may also be nitrided to form a barrier metal.

As the insulating layer (semiconductor compound formation barrier layer) that covers the diffusion layer used in the present invention, non-doped silicon oxide or silicon oxide doped with phosphorus and/or boron may preferably be used. Besides these, insulating materials such as silicon nitride, silicon nitride oxide, aluminum oxide and tantalum oxide may also be used.

In order to control reflection components of the light incident on the light-receiving part, semiconductor diffusion layer, this insulating layer may be made to have the function as a reflection preventive film. Stated specifically, as detailed later, an insulating layer having a large refractive index such as silicon nitride or silicon nitride oxide may be overlaid on the insulating layer formed of silicon oxide.

In the present invention, in order to bar formation of the semiconductor compound of the high-melting point metal, the insulating material such as non-doped silicon oxide, silicon oxide doped with phosphorus and/or boron, silicon nitride, silicon nitride oxide, aluminum oxide or tantalum oxide is formed on the top surface of the semiconductor diffusion layer before the high-melting point metal is deposited, to protect the underlying semiconductor. This insulating material may be left as the above insulating layer that covers the diffusion layer, or may be removed after the semiconductor compound layer of the high-melting point metal has been formed.

The semiconductor diffusion layer 14 used in the present invention may have an impurity density of from $1\times10^{16}$ $cm^{-3}$ to $1\times10^{18}$ $cm^{-3}$ and a junction depth of from 0.2 µm to 0.5 µm; the low-impurity-density source and drain diffusion layer 26 used in the present invention may have an impurity density of from $1\times10^{17}$ $cm^{-3}$ to $1\times10^{19}$ $cm^{-3}$ and a junction depth of from 0.05 µm to 0.3 µm; and the high-impurity-density source and drain diffusion layers 15, 16, 32 and 33 used in the present invention may each have an impurity density of from $1\times10^{19}$ $cm^{-3}$ to $1\times10^{21}$ $cm^{-3}$ and a junction depth of from 0.1 µm to 0.5 µm; any of which may be selected within these ranges.

First Embodiment

A process for fabricating the photoelectric conversion device in First Embodiment will be described with reference to FIGS. 4A to 4E.

Figure 4A:
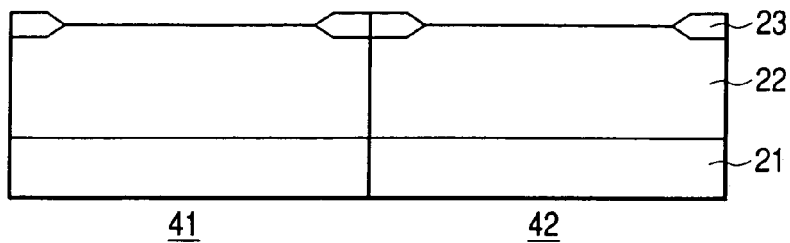
FIGS. 4A, 4B, 4C, 4D and 4E are diagrammatic cross-sectional views which illustrate a process for fabricating a photoelectric conversion device according to an embodiment of the present invention.

First, as shown in FIG. 4A, a p-type well 22 and an n-type well (not shown) are formed on a semiconductor substrate such as a silicon substrate, and an isolation region 23 is formed by selective oxidation or the like. Incidentally, in FIGS. 4A to 4E, a photoelectric conversion section 41 and a peripheral circuit section 42 are illustrated adjoiningly.

Figure 4B:
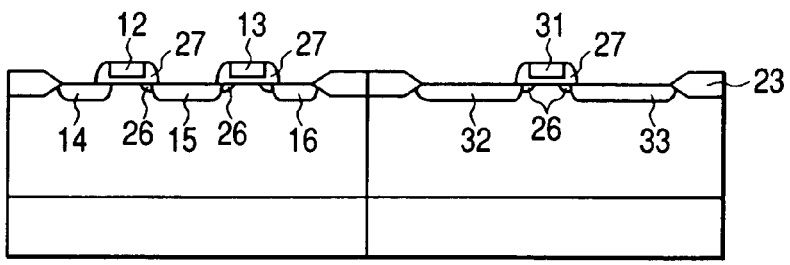

Subsequently, polycrystalline-silicon gate electrodes 12, 13 and 31 of individual MOS transistors are formed, and thereafter an n-type impurity is introduced to form a photodiode semiconductor diffusion layer 14 constituting the light-receiving part. The n-type impurity is introduced by ion implantation using the gate electrodes as masks, thus self-aligned source-drain diffusion layers 26 having a low impurity density are formed on gate electrode sides. Then, an insulating material such as silicon oxide is deposited thereon and the insulating material is etch-backed by anisotropic etching. Thus, side spacers 27 are formed on the sidewalls of the gate electrode 24. Then, an n-type impurity is introduced using the gate electrodes and side spacers as masks for ion implantation, to form on side-spacer sides, self-aligned source-drain diffusion layers 32 and 33 having a high impurity density. Thus, the structure as shown in FIG. 4B is obtained.

Figure 4C:
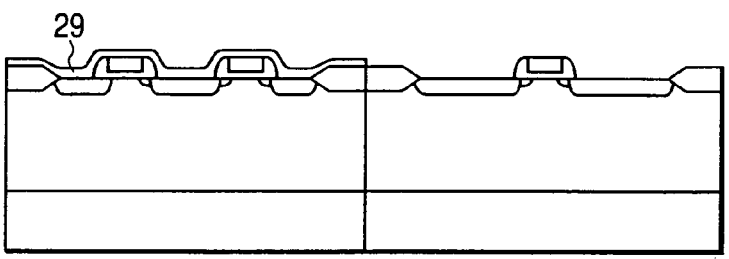

As shown in FIG. 4C, a high-melting point metal semiconductor compound formation barrier layer 29 such as a silicon oxide film is formed by CVD (chemical vapor deposition) or PVD (physical vapor deposition).

This layer is left only at the photoelectric conversion section 41 and the barrier layer 29 at the peripheral circuit section 42 is selectively removed.

Figure 4D:
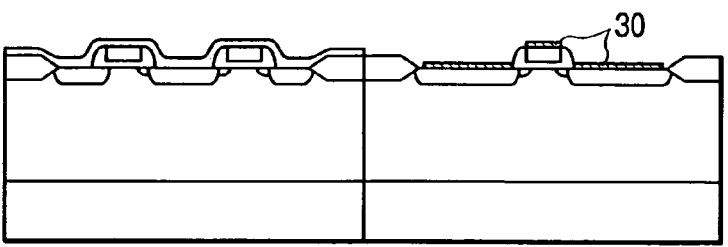

A layer (not shown) of a high-melting point metal such as Co and an anti-oxidizing layer (not shown) of a high-melting point metal such as TiN are successively formed by vacuum deposition, CVD or sputtering. These layers are heat-treated to cause the gate electrodes of MOS transistors and the silicon constituting the source and drain to react with the high-melting point metals (to effect silicidation) to form a semiconductor compound layer of the high-melting point metal. Subsequently, unreacted layers (not shown) of the high-melting point metal, remaining on the barrier layer and so forth, and the anti-oxidizing layer of the high-melting point metal are removed by immersion in an acid solution, followed by heat treatment again. Thus, as shown in FIG. 4D, semiconductor compound layers 30 of a high-melting point metal such as cobalt silicide are formed.

Figure 4E:
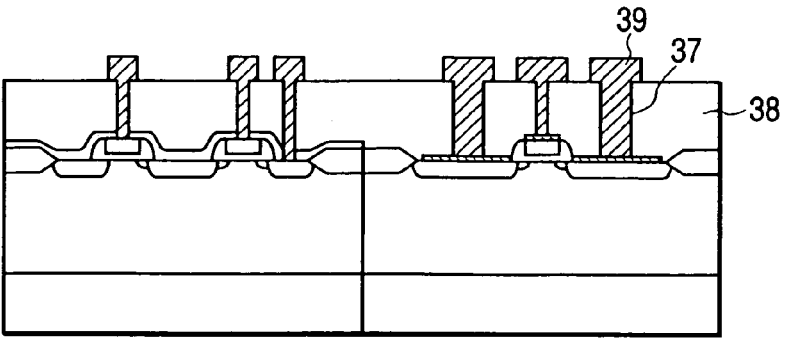

Next, an insulating layer 38 such as a BPSG (borophosphosilicate glass) film is formed, contact holes are formed, and electrodes 37 are formed therein. Wiring 39 is also formed. Thus, the structure as shown in FIG. 4E is obtained. The gate electrodes and diffusion layer of the photoelectric conversion section 41 are covered and protected with the insulating film except for the bottoms of the contact holes.

As the high-melting point metal to be made into silicide, besides Co the materials listed above may also be used. Silicidation is disclosed in, e.g., Japanese Patent Application Laid-Open No. 7-335890.

The anti-oxidation layer may also be formed as occasion calls.

In the foregoing description, an example is given in which an n-type MOS transistor is used. In the case where photoelectric conversion devices are fabricated by the CMOS process, the conductivity type may be changed to fabricate p-type MOS transistors similarly.

In the above First Embodiment of the present invention, any silicide layer of a high-melting point metal is not present at the photoelectric conversion section 41, and, at the peripheral circuit section 42, the silicide layer of a high-melting point metal is formed on the source and drain and the gate electrode, of the MOS transistor. Hence, the individual regions can be made to have a low resistance, so that the circuit can be operated at a high speed in the peripheral circuit section 42. Also, in the photoelectric conversion section 41, any great leakage current may occur and the photoelectric conversion characteristics do not deteriorate.

Second Embodiment

The Second Embodiment of the present invention employs in the MOS-type photoelectric conversion device the salicide structure at portions other than the light-receiving part 14, bounded on the gate electrode of the charge transfer MOS transistor which transfers signal charges in each photoelectric conversion section 41. Thus, it follows that at least part of the top surface of the gate electrode adjoining to the light-receiving part semiconductor diffusion layer 14 is in contact with the insulating layer. In other words, it follows that an end of the semiconductor compound layer of a high-melting point metal is disposed at the top surface of the gate electrode adjoining to the light-receiving part.

In Second Embodiment, the high-melting point metal is absent only on the semiconductor diffusion layer 14 of the photodiode in the photoelectric conversion section 41. The salicide structure is provided on the drain 15 of the charge transfer MOS transistor 2, the reset MOS transistor 3, the amplifying MOS transistor and selecting MOS transistor which constitute a source follower (formed in the depth direction of the drawing), in the photoelectric conversion section 41. Thus, compared with First Embodiment, the individual MOS transistors of the photoelectric conversion section can be operated at a high speed so that a more high-speed operation can be accomplished.

This embodiment is described below with reference to FIGS. 5A to 5D.

Figure 5A:
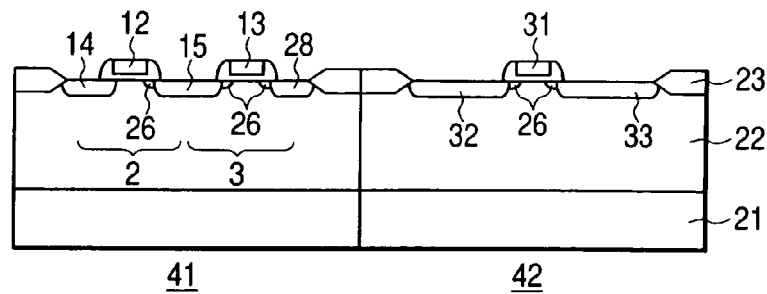
FIGS. 5A, 5B, 5C and 5D are diagrammatic cross-sectional views which illustrate a process for fabricating a photoelectric conversion device according to another embodiment of the present invention.

As shown in FIG. 5A, a well 22, an isolation region 23, gate electrodes 12, 13 and 31, a semiconductor diffusion layer 14, a low-impurity-density source-drain diffusion layer 26 and high-impurity-density source-drain diffusion layers 15, 28, 32 and 33 are formed in the same manner as in First Embodiment.

Figure 5B:
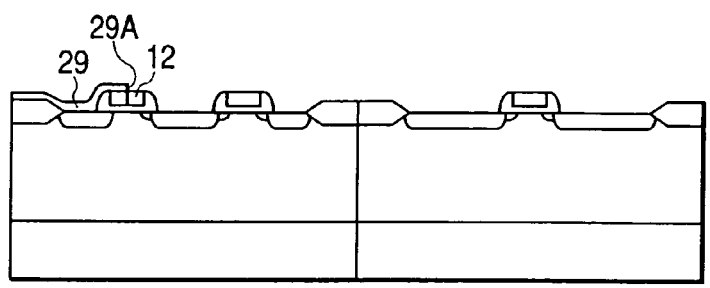

As shown in FIG. 5B, a barrier layer 29 is formed in the same manner as in First Embodiment, and the barrier layer 29 is selectively removed except for that on the semiconductor diffusion layer 14, in such a way that an end 29A is disposed on the gate electrode 12 of the charge transfer MOS transistor 2. Thus, a design margin is provided so that the semiconductor diffusion layer 14 can surely be covered with the barrier layer 29 even when any mask aberration occurs in photolithography.

Figure 5C:
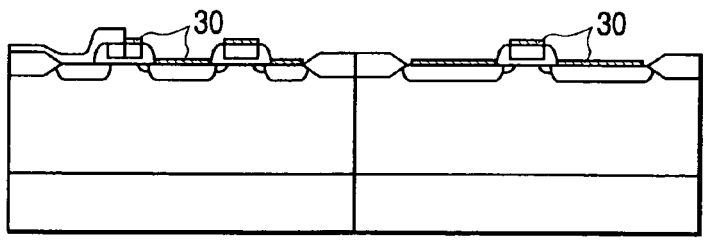

In the same manner as in First Embodiment, a high-melting point metal layer and an anti-oxidizing layer are successively formed by sputtering or the like, followed by heat treatment to effect silicidation. Unreacted layers and anti-oxidizing layers of high-melting point metals, remaining on the top of the barrier layer 29 and on the top of the isolation region are removed by immersion in an acid solution, followed by heat treatment again. Thus, as shown in FIG. 5C, semiconductor compound layers 30 of the high-melting point metal are formed.

Figure 5D:
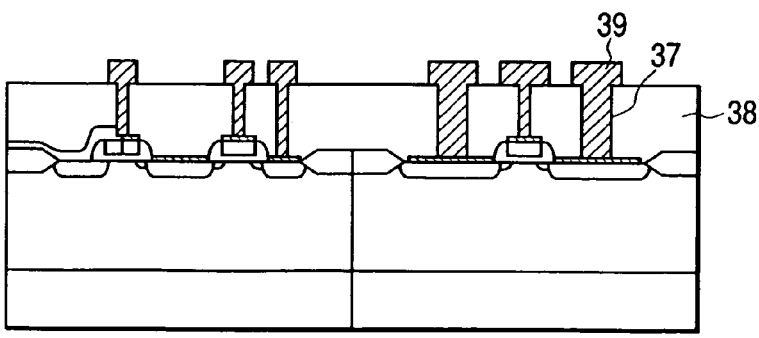

As shown in FIG. 5D, in the state where the barrier layer 29 is left, an interlayer insulating layer 38 is formed, contact holes are formed, electrodes 37 are formed and wiring 39 is formed all in the same manner as in First Embodiment.

In the above Second Embodiment of the present invention, any silicide layer of a high-melting point metal is not present on the light-receiving part of the photoelectric conversion section 41, and the silicide layers of a high-melting point metal are formed on the sources and drains and gate electrodes of the MOS transistors of the charge transfer MOS transistor 2, reset MOS transistor 3, amplifying MOS transistor and selecting MOS transistor which constitute a source follower, in the photoelectric conversion section 41, and on the source and drain and gate electrode of the peripheral circuit section 42. Hence, the individual regions can be made to have a low resistance, so that the circuit can be operated at a high speed. Also, in the photoelectric conversion section 41, any leakage current may occur less and the photoelectric conversion characteristics do not deteriorate greatly.

Third Embodiment

The Third Embodiment of the present invention employs in the MOS-type photoelectric conversion device a barrier layer for making up a region where the silicide layer of a high-melting point metal is not formed; the barrier layer being used in combination with a side spacer formed on sidewalls of the gate electrode.

Figure 6A:
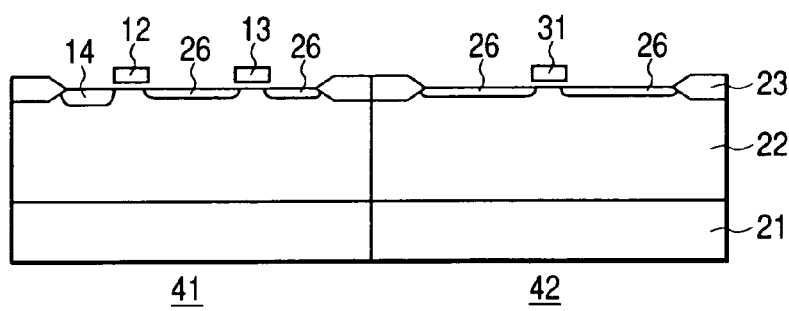
FIGS. 6A, 6B and 6C are diagrammatic cross-sectional views which illustrate a process for fabricating a photoelectric conversion device according to still another embodiment of the present invention.

First, a structure shown in FIG. 6A is prepared. In the process for fabricating MOS transistors of the photoelectric conversion section 41 and peripheral circuit section 42, the procedure of First Embodiment is repeated up to the formation of the well 22, isolation region 23, gate electrodes 12, 13 and 31, semiconductor diffusion layer 14 and low-impurity-density source-drain diffusion layer 26.

Figure 6B:
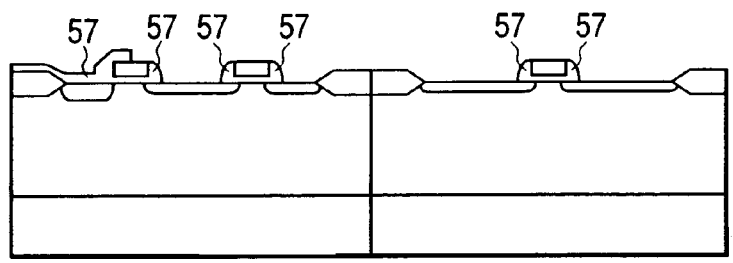

As shown in FIG. 6B, a film 57 which serves as a semiconductor compound formation barrier layer and side spacers is formed on the top surface inclusive of that of the semiconductor diffusion layer 14. Stated specifically, a film 57 such as a silicon oxide film is formed by CVD or the like. Only the top of the semiconductor diffusion layer 14 is covered with an etching mask (not shown), and only portions uncovered to the other portions are removed by reactive ion etching. Then the etching mask is removed. Thus, the film 57 remains on the semiconductor diffusion layer 14 and, on the other portions, the film 57 remains only on the sidewalls of the gate electrodes.

Figure 6C:
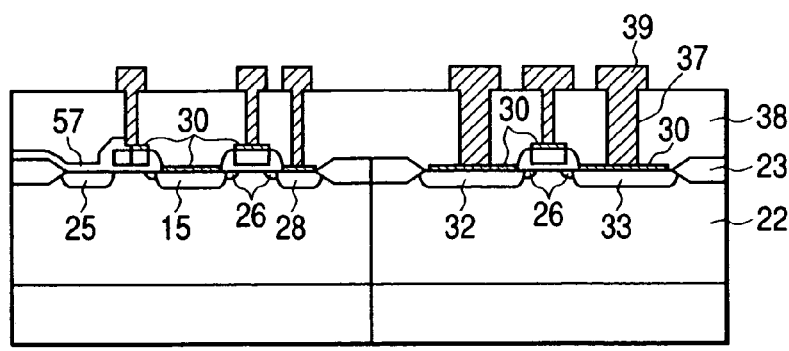

Thereafter, in the regions of the low-impurity-density source-drain diffusion layer 26, source-drain diffusion layers 15, 28, 32 and 33 having a high impurity density are selectively formed by a self-aligned process using the side spacers as masks. Next, in the same manner as in First Embodiment, a high-melting point metal layer and an anti-oxidizing layer are successively formed by sputtering or the like, followed by heat treatment to effect silicidation. Unreacted layers and anti-oxidizing layers remaining on the top of films 57 are removed by immersion in an acid solution, followed by heat treatment again. Thus, silicide layers 30 are formed. An interlayer insulating layer 38 is formed, contact holes are made, electrodes 37 and wiring 39 are formed. Thus, the structure as shown in FIG. 6C is obtained.

In this embodiment, the silicide layer is formed after the high-impurity-density source-drain diffusion layers have been formed. Alternatively, the high-impurity-density source-drain diffusion layers may be formed after the silicide layer 30 has been formed, followed by ion implantation.

In the present embodiment, a protective film at the part where the salicide structure is not employed is used in combination with the side spacer formed on the sidewalls of the gate electrode. Hence, the production cost can be kept low.

Fourth Embodiment

FIG. 7 shows a cross section of a photoelectric conversion device according to the present embodiment.

What is different from the construction shown in FIG. 1 is that an additional insulating layer 59 having a large refractive index is provided on the insulating layer 29, which also functions as the barrier layer against formation of the semiconductor compound having a high-melting point metal, and that a light-screening film 58 having an opening 56 is provided so that the light enters substantially only the semiconductor diffusion layer 14.

The insulating layer 29 may have a thickness selected within the range of from 5 nm to 300 nm, and the additional insulating layer 59 may have a thickness selected within the range of from 7 nm to 120 nm.

For example, the thickness that is optimum to blue light of 450 nm in wavelength is 154 nm and 57 nm for the insulating layer 29 and the additional insulating layer 59, respectively, when silicon oxide (refractive index: 1.46) is selected as the former and silicon nitride (refractive index: 2.00) as the latter. The thickness that is optimum to green light of 550 nm in wavelength is 188 nm and 69 nm for the insulating layer 29 and the additional insulating layer 59, respectively, when silicon oxide is selected as the former and silicon nitride as the latter. The thickness that is optimum to red light of 650 nm in wavelength is 233 nm and 81 nm for the insulating layer 29 and the additional insulating layer 59, respectively, when silicon oxide is selected as the former and silicon nitride as the latter.

When silicon nitride oxide (refractive index: 1.65) is selected as the additional insulating layer 59, the thicknesses that are optimum to blue light, green light and red light are 68 nm, 84 nm, and 99 nm, respectively.

For example, in the light of 550 nm in wavelength, its reflectance is about 6% when the insulating layer 29 formed of silicon oxide has a thickness of 188 nm and the additional insulating layer 59 formed of silicon nitride has a thickness of 69 nm, whereas it reaches as high as 27% when any additional insulating layer 59 formed of silicon nitride is not provided.

The light-screening film 58 may be used also as wiring for supplying a high reference voltage, such as a power source line, or wiring for supplying a low reference voltage, such as a grounding line. Such lines may also be provided separately and independently, or need not be provided in some cases.

Fifth Embodiment

Figure 8:
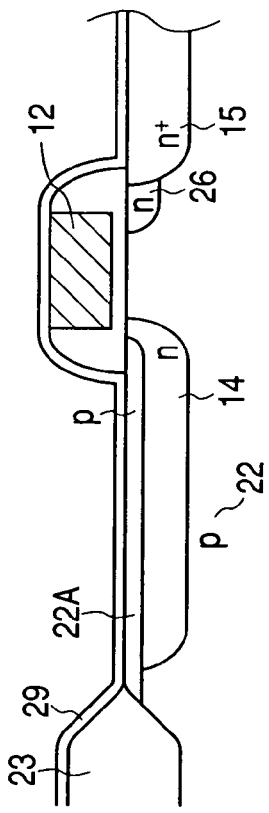
FIG. 8 is a diagrammatic cross-sectional view of the photoelectric conversion device according to still another embodiment of the present invention.

FIG. 8 shows a cross-sectional structure of the light-receiving part and the vicinity thereof, according to the present embodiment.

In this embodiment, a p-type semiconductor diffusion layer 22A is provided between the n-type semiconductor diffusion layer 14 and the insulating layer 29; the former storing the electrical charges (electrons here) created by the light having entered. It is provided in order to prevent dark currents from being caused by any defects present at the interface between the insulating layer and the semiconductor and also to provide a buried photodiode structure made to have a large storage capacity by providing p-n junctions above and beneath the semiconductor diffusion layer 14.

Thus, the surface of the p-type semiconductor diffusion layer 22A constituting part of the anode is covered with the insulating layer 29, and any semiconductor compound layer of a high-melting point metal, such as a silicide layer, is not formed thereon.

If the high-melting point metal is formed on the surface of the semiconductor diffusion layer 22A and the silicidation reaction takes place, not only may leakage currents greatly occur, but also there is a possibility that the p-n junction of the thin p-type semiconductor diffusion layer 22A on the surface side could be broken. Accordingly, in the photoelectric conversion device having the light-receiving part having such a buried photodiode structure, it is very effective not to form at the light-receiving part any semiconductor compound layer of a high-melting point metal.

Sixth Embodiment

A process for fabricating the photoelectric conversion device according to the present embodiment is described below with reference to FIGS. 9A to 9E.

A semiconductor substrate is prepared and a p-type well 22 is formed. Thereafter, an isolation region 23 is formed by selective oxidation. Then, gate insulating films are formed and thereafter conductors such as polycrystalline silicon serving as gate electrodes are deposited, followed by patterning.

Figure 9A:
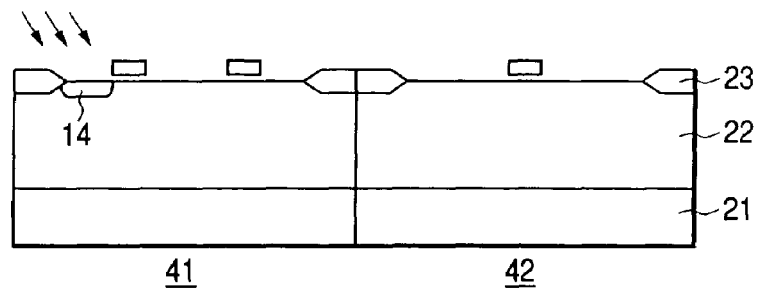

Next, the portions other than the part serving as the light-receiving part are covered with a mask (not shown) formed using a photoresist, and an n-type impurity is ion-implanted to form an n-type semiconductor diffusion layer 14. In this case, as shown in FIG. 9A, ions may be implanted in the direction inclined by 30 degrees with respect to the normal line of the substrate surface so that a p-n junction is disposed beneath the gate electrode. The angle of inclination is by no means limited to 30 degrees, and may preferably be selected within the range of from 10 degrees to 60 degrees.

Then, a p-type impurity is ion-implanted to form a p-type semiconductor diffusion layer 22A. Thus, an end of the p-type semiconductor diffusion layer 22A can be disposed at a position separated from the end of the n-type semiconductor diffusion layer 14 which end lies beneath the gate electrode 12.

In order to form a diffusion layer 26 serving as the source and drain, having a low impurity density, an n-type impurity is further implanted while masking the regions serving as the light-receiving part. In this case, ions may be implanted while in-plane rotating the substrate, in the direction inclined by 10 degrees to 60 degrees with respect to the normal line of the substrate surface so that ends of the low-impurity-density source and drain are disposed beneath the gate electrode without regard to the direction of the MOS transistor. Also, a low-impurity-density source and drain (not shown) for the p-type MOS transistor is similarly formed.

Figure 9B:
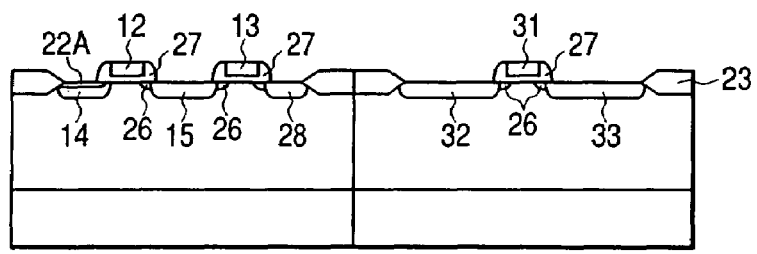

Next, an insulator such as silicon oxide is deposited by CVD or the like, and thereafter the insulating material is etch-backed by, e.g., reactive etching. Thus, side spacers 27 are formed on the sidewalls of the gate electrodes 12, 13 and 31. Then, an n-type impurity is ion-implanted using the photoelectric conversion section 41 as a mask (not shown) for ion implantation, formed using a photoresist, and the side spacers also as masks, to form on side spacer sides, self-aligned source-drain diffusion layers 15, 28, 32 and 33 having a high impurity density. Also, high-impurity-density source and drain (not shown) for the p-type MOS transistor are similarly formed. Thus, the structure as shown in FIG. 9B is obtained.

Figure 9C:
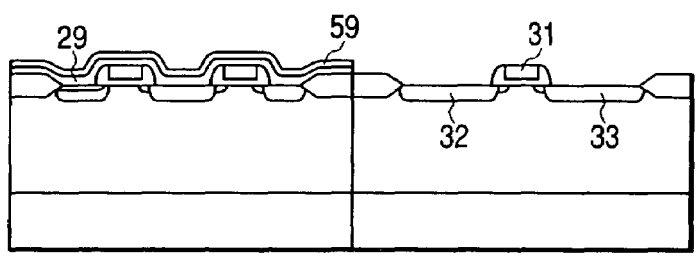

Subsequently, as barrier layers 29 and 59 against formation of the semiconductor compound of a high-melting point metal, an insulating layer having a low refractive index such as a silicon oxide layer and an insulating layer having a high refractive index such as a silicon nitride or silicon nitride oxide layer are formed by CVD or the like. When these insulating layers are left, their thickness is so determined that these function as reflection preventive layers. Then, the insulating layers 29 and 59 in the region involving the source and drain and gate electrode on which the semiconductor compound layer of a high-melting point metal is to be formed are removed by etching to uncover the surfaces of the semiconductor diffusion layers 32 and 33 and the surface of the gate electrode 31. Thus, the structure as shown in FIG. 9C is obtained.

Figure 9D:
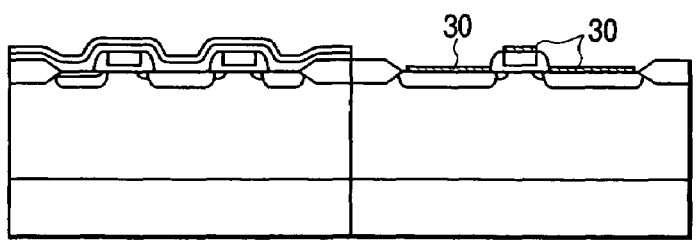

Then, a layer of a high-melting point metal such as Co and an anti-oxidizing layer of a high-melting point metal such as TiN are successively formed by vacuum deposition, CVD or sputtering. These layers are heat-treated at a temperature sufficient for causing the semiconductor compound to react, to cause the high-melting point metal to react, at least at its under surface side, with the semiconductor to form semiconductor compound layers 30 of the high-melting point metal. Unreacted high-melting point metal layers and the anti-oxidizing layer are removed using an etchant such as a solution of mixture of sulfuric acid with hydrogen peroxide water. Thus, as shown in FIG. 9D, semiconductor compound layers 30 of the high-melting point metal are formed in self-alignment.

Figure 9E:
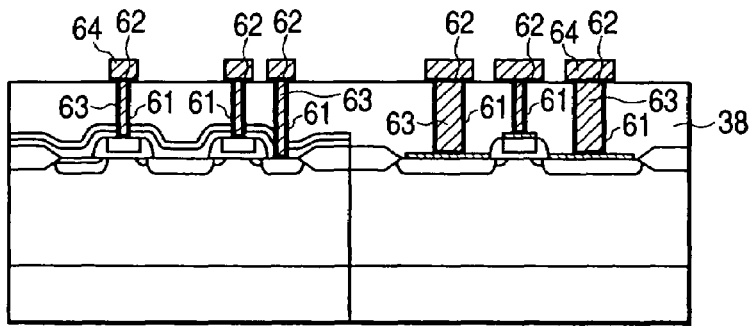

After an interlayer insulating layer 38 such as a BPSG film is formed, the surface may optionally be smoothed by CMP (chemical mechanical polishing) or reflowing. Then, contact holes are made in interlayer insulating layer 38 by reactive ion etching. Barrier metals 61 such as titanium and titanium nitride are formed on the bottoms and sidewalls of the contact holes by CVD or sputtering, and thereafter a conductor comprised of a metal such as aluminum, copper or tungsten or an alloy composed chiefly of any one of these is formed by a process such as CVD, sputtering or plating to bury conductors which serve as electrodes 61, in the contact holes. The barrier metals and conductors lying above the top surface of the interlayer insulating layer 38 may optionally be removed by etching or CMP. Barrier metals 62 are again formed, and a conductor comprised of a metal such as aluminum, copper or tungsten or an alloy composed chiefly of any one of these is deposited by a process such as CVD, sputtering or plating, followed by patterning to form wiring 62. Thus, the structure as shown in FIG. 9E is obtained.

Seventh Embodiment

Figure 10:
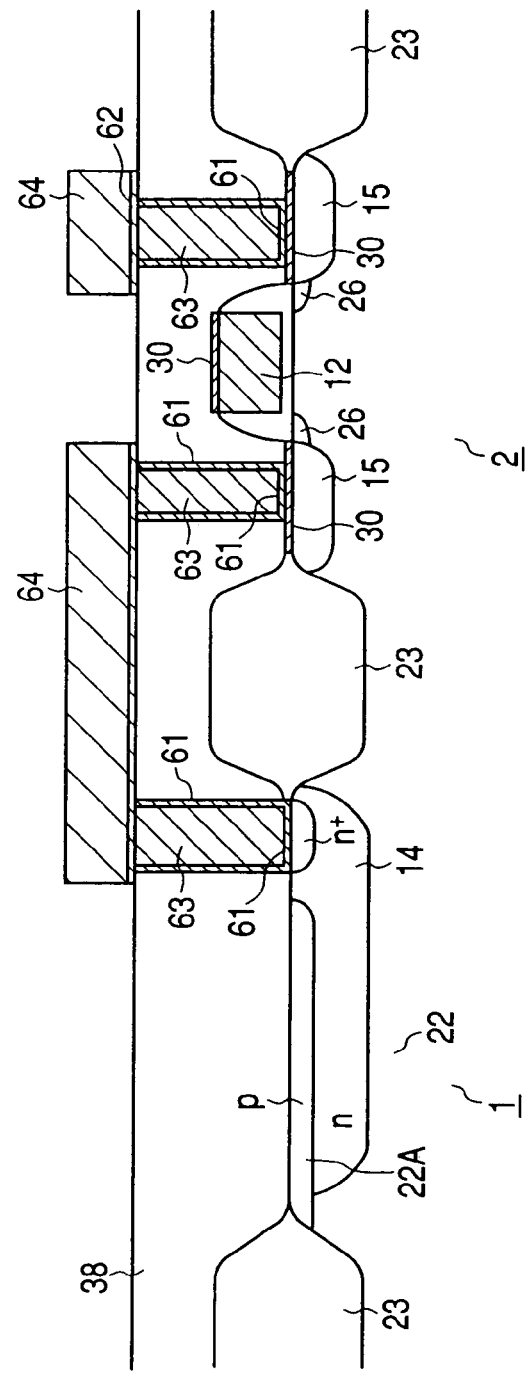
FIG. 10 is a diagrammatic cross-sectional view of the photoelectric conversion device according to still another embodiment of the present invention.

FIG. 10 shows a cross-sectional structure of a photoelectric conversion device according to the present embodiment.

In the present embodiment, an n-type semiconductor diffusion layer 14 serving as the cathode of a photodiode is provided with a high-impurity-density layer for an ohmic contact, and is connected to an electrode 63 in a contact hole via this layer and a barrier metal 61. The semiconductor compound layer 30 of a high-melting point metal is provided on the top surfaces of source and drain 15 and gate electrode 12. The part of the contact hole of the semiconductor diffusion layer 14 is substantially light-screened by the electrode 63 and wiring 64, and the surface of the n-type semiconductor diffusion layer 14 and the surface of a p-type semiconductor diffusion layer 22A, except for that part, are covered with an interlayer insulating film 38 such as a silicon oxide film. Here, a semiconductor compound formation barrier layer (not shown) used when the semiconductor compound layer 30 of a high-melting point metal is formed is removed in a later step and thereafter the interlayer insulating film 38 is formed.

Here is illustrated a charge transfer transistor as the MOS transistor. A reset MOS transistor can also be made up like the transistor illustrated here.

This embodiment may also be so modified as to connect the cathode of the photodiode to the gate electrode 12 of the MOS transistor, where the transistor as illustrated can also be used as an amplifying MOS transistor.

In the embodiments described above, it is apparent that the device may be made up also when the p-type is replaced with the n-type and the relation of potential is inverted.

The photoelectric conversion device of the present invention may also be used as a linear sensor where light-receiving areas are arranged in a row, and may also be used as an area sensor where they are arranged in a two-dimensional array.

Figure 11:
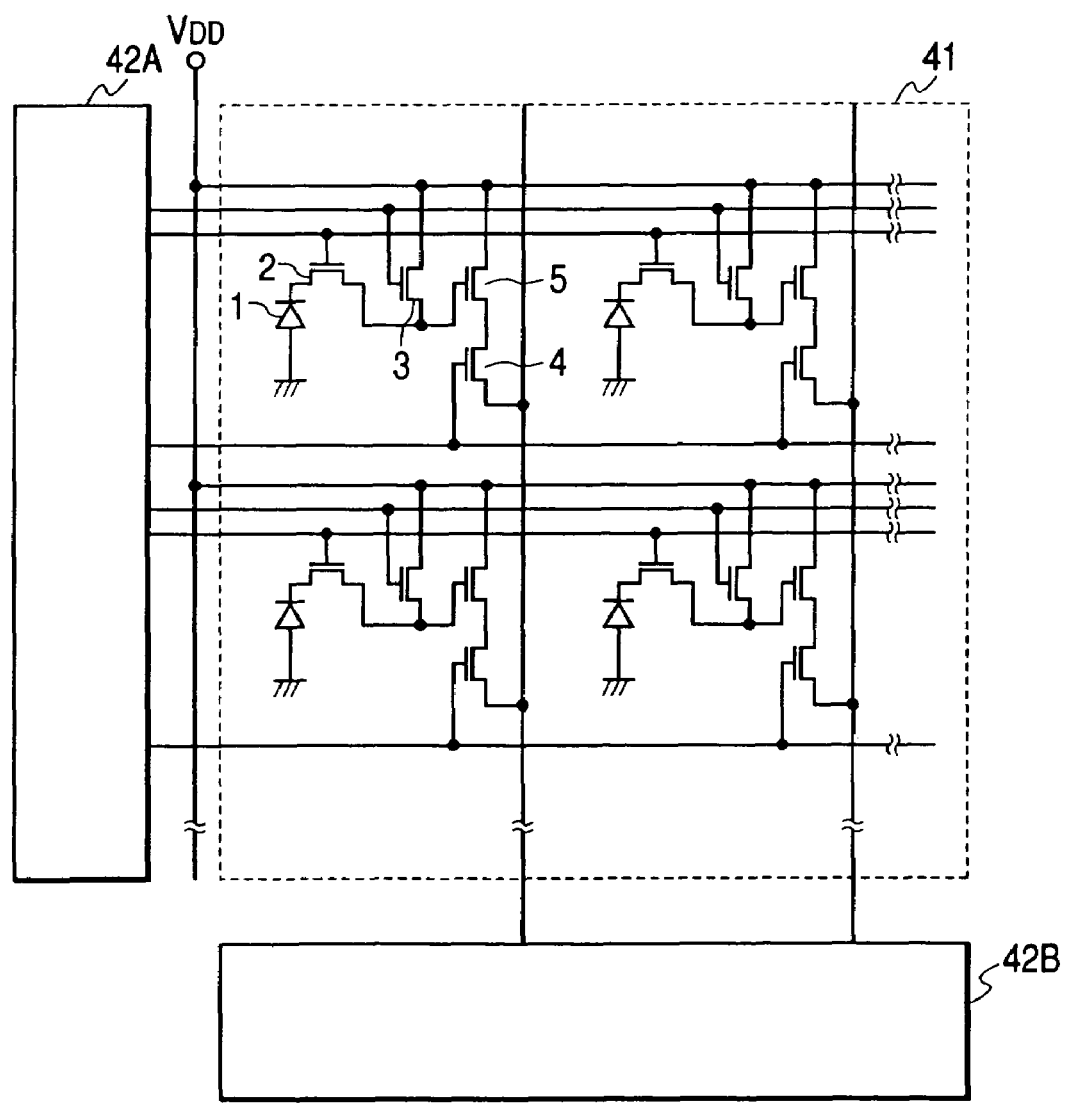
FIG. 11 is a circuit diagram of a photoelectric conversion device used in the present invention.
Figure 12:
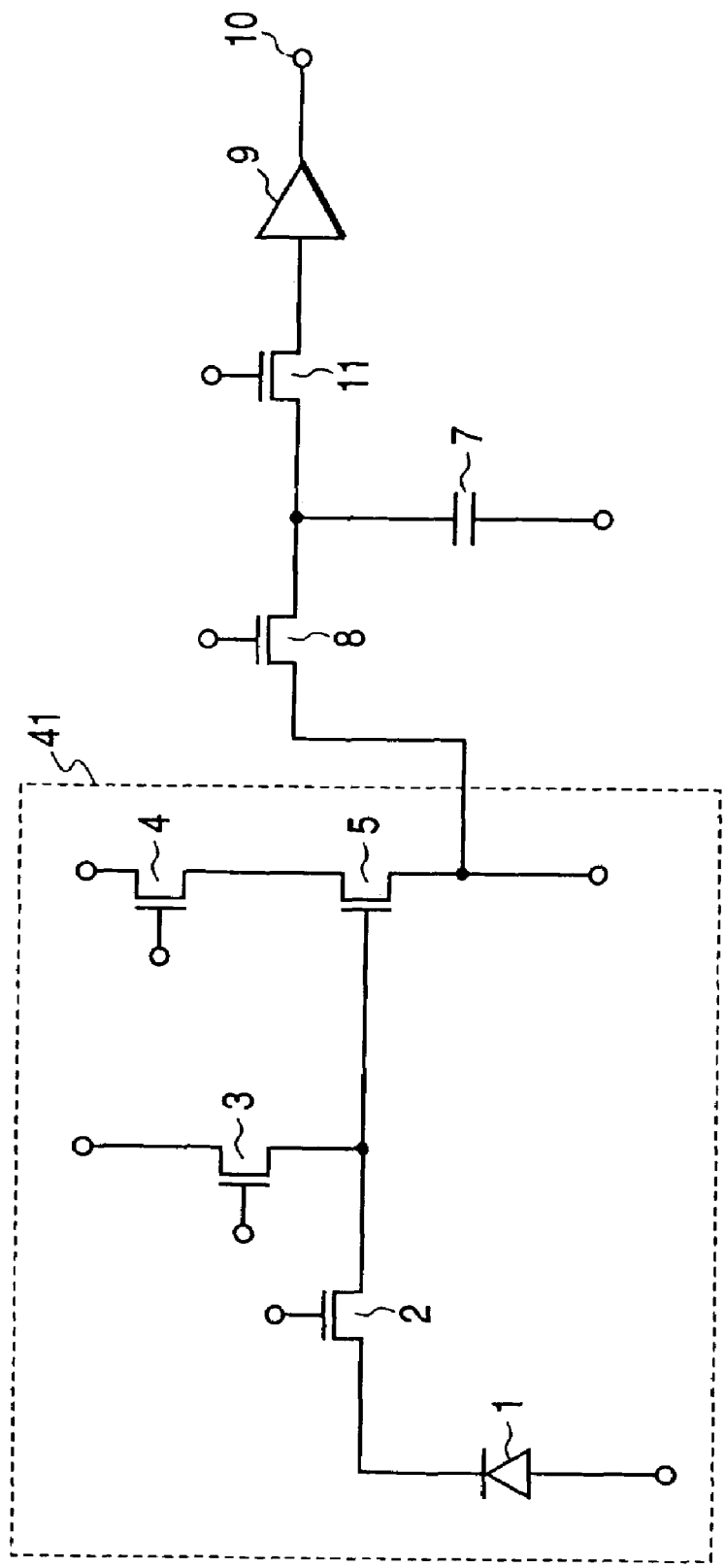
FIG. 12 is a circuit diagram of a photoelectric conversion device.
Figure 13:
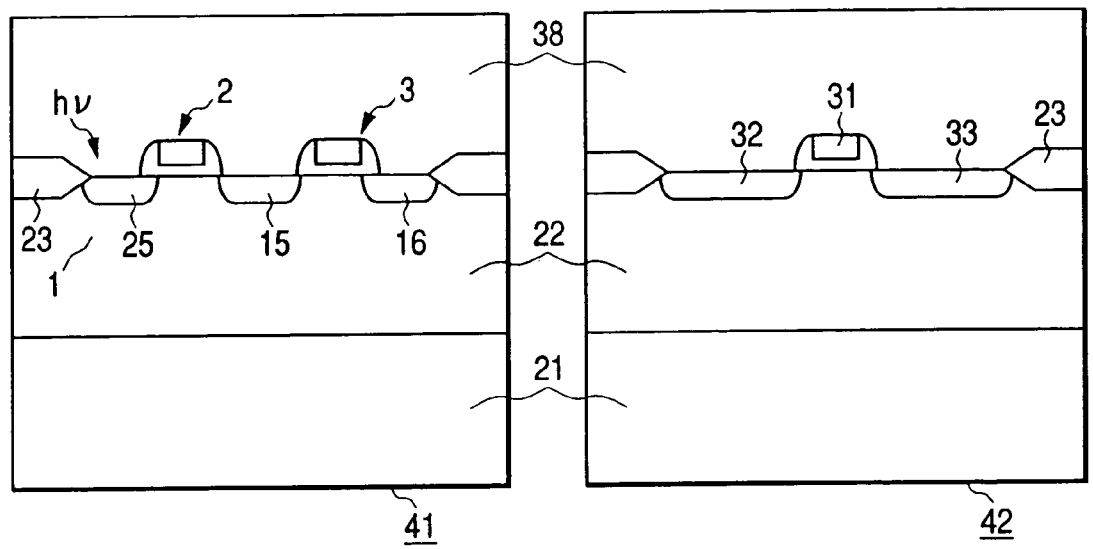
FIG. 13 is a diagrammatic cross-sectional view of a conventional photoelectric conversion device.
Figure 14:
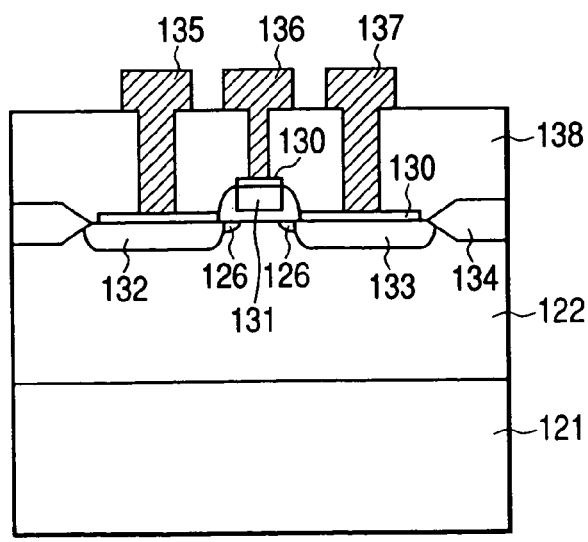
FIG. 14 is a diagrammatic cross-sectional view of a conventional theoretical-circuit MOS transistor.

An example of such an area sensor is shown in FIG. 11. Here, only two-row, two-column pixels are shown as photoelectric conversion sections 41. In practice, however, a hundred thousand (100,000) to ten million (10,000,000) pixels are arranged. Reference numeral 42A denotes a peripheral circuit constituted of row-selection circuits such as a shift register for selecting read pixels and a shift register for selecting reset pixels; and 42B, a peripheral circuit constituted of a signal-read circuit having a horizontal shift register, a sample-and-hold circuit and a low-current source. In the case of such a photoelectric conversion device, the semiconductor compound formation barrier layer may be provided in the region corresponding to the photoelectric conversion section 41 on a wafer, followed by salicidation processing, and, in the peripheral circuit section 42, the semiconductor compound layers may be formed on MOS transistors of the peripheral circuits 42A and 42B.

Figure 15:
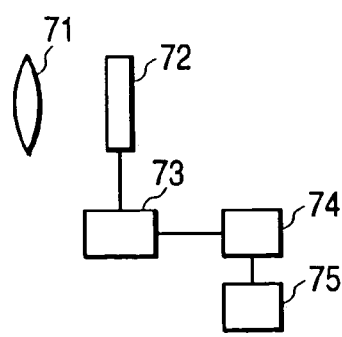
FIG. 15 is a diagrammatic view of an image information processing device making use of the photoelectric conversion device of the present invention.

FIG. 15 shows an image information processing device such as a digital still camera or a digital video camera, according to the present invention. Reference numeral 71 denotes an optical lens which forms images of objects on a photoelectric conversion device; 72, the photoelectric conversion device described above; and 73, a control circuit having an MPU (microprocessing unit), which performs control to process image signals outputted from the photoelectric conversion device and to store the processed signals in a storage medium 75. Reference numeral 74 denotes a write circuit which writes image information to the storage medium 75. As the storage medium 75, usable are known semiconductor memories, magnetic recording mediums, optical recording mediums, optical-magnetic recording mediums and so forth.

What is claimed is:

1. A photoelectric conversion device comprising a photoelectric conversion section and a peripheral circuit section where signals sent from the photoelectric conversion section are processed, both sections being provided on the same semiconductor substrate, wherein:

a semiconductor compound layer of a high-melting point metal is provided on a gate electrode, source, and drain of an MOS transistor that forms the peripheral circuit section and not provided on the photoelectric conversion section;

the top surface of a semiconductor diffusion layer that serves as a light-receiving part of the photoelectric conversion section is in contact with an insulating layer, and not in contact with the semiconductor compound layer;

at least a top surface of a gate electrode of an MOS transistor that forms the photoelectric conversion section is in contact with the insulating layer; and the insulating layer functions as a barrier layer of formation of the semiconductor compound layer.

2. The photoelectric conversion device according to claim 1, wherein at least part of the top surface of a gate electrode adjoining the light-receiving part is in contact with the insulating layer.

3. The photoelectric conversion device according to claim 1, wherein an end of the semiconductor diffusion layer is in contact with the insulating layer.

4. The photoelectric conversion device according to claim 1, wherein the semiconductor diffusion layer comprises a second-conductivity type semiconductor layer provided between a first-conductivity type semiconductor layer where photoelectrically converted electrical charges are stored and the insulating layer.

5. The photoelectric conversion device according to claim 1, wherein the source and drain of the MOS transistor have at least two regions having impurity densities different from each other, and the semiconductor compound layer of a high-melting point metal is formed only on the region having a higher impurity density of the regions.

6. The photoelectric conversion device according to claim 1, wherein the photoelectric conversion section has at least one of an amplifying MOS transistor, a reset MOS transistor and a selecting MOS transistor.

7. The photoelectric conversion device according to claim 1, wherein the photoelectric conversion section has an amplifying MOS transistor, a reset MOS transistor and a selecting MOS transistor, and the semiconductor compound layer of the high-melting point metal is provided on the gate electrodes and sources and drains of these transfer MOS transistors.

8. The photoelectric conversion device according to claim 1, wherein the insulating layer is a reflection preventive film.

9. The photoelectric conversion device according to claim 8, wherein the insulating layer comprises a plurality of layers having refractive indexes different from one another.

10. The photoelectric conversion device according to claim 1, which has a light-screening layer, and the semiconductor compound layer of the high-melting point metal is provided on the gate electrode and source and drain of all MOS transistors light-screened by the light-screening layer.

11. The photoelectric conversion device according to claim 1, wherein the semiconductor compound layer of the high-melting point metal comprises a metal selected from the group consisting of titanium silicide, nickel silicide, cobalt silicide, tungsten silicide, molybdenum silicide, tantalum silicide, chromium silicide, palladium silicide, platinum silicide, vanadium silicide and zirconium silicide.

12. The photoelectric conversion device according to claim 1, wherein;

the source and drain of the MOS transistor of the photoelectric conversion section have at least two regions having impurity densities different from each other, and the semiconductor compound layer of the high-melting point metal is not formed on the region having a higher impurity density of the regions, except for at the bottoms of contact holes; and the MOS transistor of the peripheral circuit section has at least two regions having impurity densities different from each other, and the semiconductor compound layer of the high-melting point metal is formed on the region having a higher impurity density of the regions.

13. An image information processing device comprising the photoelectric conversion device according to claim 1, and a circuit which processes image signals outputted from the photoelectric conversion device and stores the processed signals in a storage medium.

14. The image information processing device according to claim 13, which is a digital still camera or a digital video camera.

15. The photoelectric conversion device according to claim 1, wherein the photoelectric conversion section has an amplifying MOS transistor, a reset MOS transistor and a selecting MOS transistor; the top surface of the gate electrodes, sources, and drains of these transfer MOS transistors are in contact with the insulating layer except for at the bottoms of contact holes; and the photoelectric conversion section further has a floating diffusion layer which receives electrical charges transferred from the semiconductor diffusion layer, and the top surface of the floating diffusion layer is in contact with the insulating layer except for at the bottom of contact holes.

* * * * *

UNITED STATES PATENT AND TRADEMARK OFFICE
CERTIFICATE OF CORRECTION

PATENT NO. : 7,342,269 B1  Page 1 of 1
APPLICATION NO. : 09/633175
DATED : March 11, 2008
INVENTOR(S) : Hiroshi Yuzurihara It is certified that error appears in the above-identified patent and that said Letters Patent is hereby corrected as shown below:

ON THE TITLE PAGE:
At Item (54), "DEVICE," should read --DEVICE--.

ON THE TITLE PAGE, At (57), ABSTRACT:
Line 4, "the" (first occurrence) should be deleted.

COLUMN 2:
Line 67, "circuit the" should read --circuit, a--.

COLUMN 10:
Line 10, "source and" should read --source,--.

Signed and Sealed this

Tenth Day of February, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,342,269 B1  
APPLICATION NO. : 09/633175  
DATED : March 11, 2008  
INVENTOR(S) : Hiroshi Yuzurihara Page 1 of 1

It is certified that error appears in the above-identified patent and that said Letters Patent is hereby corrected as shown below:

ON THE TITLE PAGE:
At Item (54) and Column 1, line 1, "DEVICE," should read --DEVICE--.

ON THE TITLE PAGE, At (57), ABSTRACT:
Line 4, "the" (first occurrence) should be deleted.

COLUMN 2:
Line 67, "circuit the" should read --circuit, a--.

COLUMN 10:
Line 10, "source and" should read --source,--.

This certificate supersedes the Certificate of Correction issued February 10, 2009.

Signed and Sealed this

Tenth Day of March, 2009

JOHN DOLL  
*Acting Director of the United States Patent and Trademark Office*